United States Patent [19]

Walker

[11] Patent Number: 4,810,879
[45] Date of Patent: Mar. 7, 1989

[54] CHARGED PARTICLE ENERGY ANALYZER

[75] Inventor: Andrew R. Walker, Prestbury, England

[73] Assignee: Spectros Limited, Manchester, England

[21] Appl. No.: 36,899

[22] Filed: Apr. 10, 1987

[30] Foreign Application Priority Data

Apr. 22, 1986 [GB] United Kingdom ............... 8609740

[51] Int. Cl.⁴ .............................................. H01J 49/44
[52] U.S. Cl. ..................................... 250/305; 250/306
[58] Field of Search ................................ 250/305, 306

[56] References Cited

U.S. PATENT DOCUMENTS 3,766,381  10/1973  Watson .
3,822,382   7/1974  Koike .
4,680,467   7/1987  Bryson et al. .

FOREIGN PATENT DOCUMENTS 1367302  9/1974  United Kingdom .
1564523  4/1980  United Kingdom .

Primary Examiner—Bruce C. Anderson
Assistant Examiner—Jack I. Berman
Attorney, Agent, or Firm—Leydig, Voit & Mayer

[57] ABSTRACT

A charged particle energy analyzer, such as a microscope or spectrometer, includes a magnetic immersion lens 10 to focus charged particles emitted from an irradiated specimen 5 located within the magnetic field of the lens. A collecting aperture 18 defines the area of the irradiated specimen from which charged particles can be brought to a focus in the image plane of the lens but an aperture 21 in this plane selects and defines a much smaller area of the specimen from which the received particles are passed to a suitable energy analyzing means 25. The energy analyzing means 25 then performs energy analysis of the small selected area of the specimen by imaging the small area with emitted particles of a predetermined energy, or energy scanning the particles emitted from this area, so giving a chemical analysis of the small selected area of the specimen surface.

9 Claims, 4 Drawing Sheets

CHARGED PARTICLE ENERGY ANALYZER

BACKGROUND OF THE INVENTION

This invention relates to charged particle energy analysers and in particular to charged particle microscopes, including spectromicroscopes. More particularly, the invention relates to charged particle energy analysers for investigating a selected area of the surface of a specimen.

It is known for example from GB-A-No. 1,367,302 to provide a charged particle energy analyser for investigating a selected area of the surface of a specimen comprising a specimen holder, a source of radiation arranged to direct radiation on to an external surface of a specimen on the holder and to cause charged particles to be emitted therefrom, a magnetic lens so disposed that the specimen holder lies within and on the axis of the magnetic imaging field of the lens and particles emitted from the specimen are brought to a focus by the field, a diaphragm containing a collection aperture disposed on the axis of the field to define the collection angle of the lens and analysing means for analysing the energy of the charged particles collected from the specimen and received by said analysing means.

In the analyser of GB-A-No. 1,367,302 the selected area of the specimen from which the analysing means receives charged particles is the whole area of the specimen on the axis from which the collection aperature receives charged particles. This however, does not enable the operator to examine charged particles received from only a very small selected area of the specimen, for example of the order of 10–50 microns diameter, rather than of about 250 microns diameter as in current practice.

BRIEF SUMMARY OF THE INVENTION

According to the present invention there is provided a charged particle energy analyser for investigating a selected area of the surface of a specimen comprising a specimen holder, a source of radiation arranged to direct radiation on to an external surface of a specimen on the holder and to cause charged particles to be emitted therefrom, a magnetic lens so disposed that the specimen holder lies within and on the axis of the magnetic imaging field of the lens and particles emitted from the specimen are brought to a focus by the field, a diaphragm containing a collection aperture disposed on the axis of the field to define the collection angle of the lens and analysing means for analysing the energy of the charged particles collected from the specimen and received by said analysing means, characterised by a further diaphragm containing an aperture on or adjacent to the axis of the lens and located between said collection aperture and the analysing means to define a restricted area of the specimen from which the particles are brought to a focus, and supplied to said analysing means.

The charged particles with which the invention is concerned can be electrons, positive ions or negative ions, but for ease of description consideration below will normally be restricted to electrons.

In particular, a magnetic electron immersion lens is used. If the specimen is bombarded with X-rays, photoelectrons from the selected area of the specimen surface are emitted into the magnetic imaging field of the lens. The field which is produced by the lens causes electrons over a certain energy range to be imaged. The resulting electronic image can be energy analysed by a suitable imaging energy analyser for example that described by R. Castaing and L. Henry in Comptes Rendus (Academy of Science, Paris) 255B. p76 et seq., 1962. The energy resolved image can then be magnified further, if required, and the final image projected on to a phosphor screen or other suitable device for registering the image.

By altering the strength of the magnetic immersion lens and of the analyser it is possible to record a spectrum of the energies of the photoelectrons and also to display selected energies on the final screen. The spectrum contains information enabling deductions to be made about the composition, nature and chemical structure of the interior of the specimen as well as of its surface and of any atoms or molecules attached to or lying on the surface. The electrons released from the specimen following irradiation by photons or electrons or ions or neutrals (atoms and molecules) have a range of energies that depends upon the nature of the irradiation and the nature of the specimen.

In some applications, such as irradiation by photons of energy from 5–40 electron volts, the released electrons have energies in the range from zero to about 5 or up to 40 electron volts respectively. Such released electrons are photoelectrons generated by ultraviolet radiation. If the energy of the irradiating photons is greater than 100 electron volts or so, then the electrons are X-ray photoelectrons. Both ultraviolet (UV) excited and X-ray excited photoelectrons can convey chemical and other information.

Thus the photoelectron microscope with the magnetic immersion lens and energy analysing means is capable of magnifying the details of the surface and indicating changes in chemical environment thereon.

The preferred form of lens for use in the present invention is a snorkel magnetic electron lens, that is to say a lens with one principal pole-piece when extends along the axis of the lens beyond the adjacent pole piece. Such a lens is described by T. Muley in 'Magnetic Electron Lenses' edited by P. W. Hawkes and published by Springer Verlag (1982) pp 349–412. However, other forms of magnetic lens can be used to provide a focusing field for the emitted electrons. The apparatus can also include means for magnifying the energy analysed electron image and means for producing a final image on a suitable screen.

BRIEF DESCRIPTION OF THE DRAWINGS

The invention, and the theory on which it is based, will now be particularly described with reference to the accompanying drawings in which.

DETAILED DESCRIPTION

Figure 1:
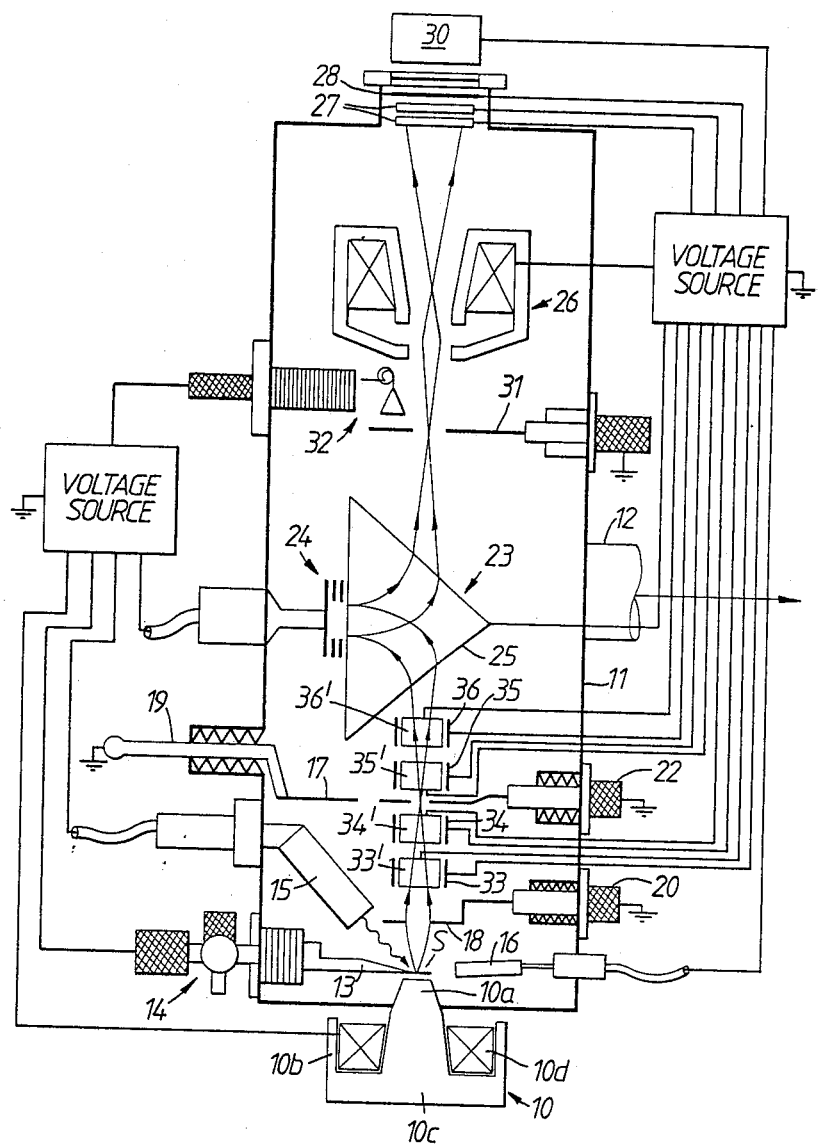
FIG. 1 is a diagrammatic section through one form of charged particle energy analyser according to the invention.

FIG. 1 shows a high energy emission microscope with energy analysis facilities. The apparatus comprises a magnetic electron lens 10 of the snorkel type having a centre pole 10a on the axis of the microscope, an annular coaxial pole 10b, and a base 10c integral with poles 10a and 10b. A coil 10d is mounted in the annular trough between the two poles to excite the centre pole when energised by a current, and produce a field along the axis of the microscope.

The protruding end of the 'snorkel' pole piece 10a is sealed within the wall of a vacuum enclosure 11 which can be evacuated to an ultra high vacuum (preferably $p < 10^{-10}$ torr) via a pumping manifold 12. The coil can, as shown, be mounted outside the vacuum enclosure 11.

Located immediately in front of polepiece 10a on the axis of the magnetic lens is a specimen holder 13. This holder is mounted within the housing 11 on a manipulator 14 which enables the position of a specimen supported on the holder to be varied in any direction.

Disposed adjacent the specimen holder is the irradiation source 15, which typically can be a source of X-radiation, such as MgK $\alpha$ X-radiation. Bombardment of a specimen on the specimen holder with such radiation will cause photoelectrons to be emitted into the magnetic field of the lens, and these electrons will be brought to a focus downstream of the lens, as will be described below.

A low energy gun 16 if required can be located adjacent the specimen holder for the charge neutralisation of insulating samples.

X-ray photoelectrons emitted from the sample pass through a first apertured diaphragm 18 which is mounted on a suitable manipulator 20. This and other apertured diaphragms will normally be referred to hereafter by the word 'aperture'. The aperture 18 is used to define the collection angle of the electron beam.

Downstream of the aperture 18 is a second aperture 21 mounted on a manipulator 22 and the image formed at aperture 21 is a magnified image of part of the surface of the specimen S. A suitable magnification will lie between $10\times$ and $20\times$.

The electron trajectories from only a single point of the surface are shown for clarity. However, in reality a series of points will be imaged in the plane of the second aperture 21.

If required a viewing screen 17 mounted on a manipulator 19 can be moved into the path of the electrons in the plane of the second aperture 21 for viewing the ejected photoelectrons.

Figure 2:
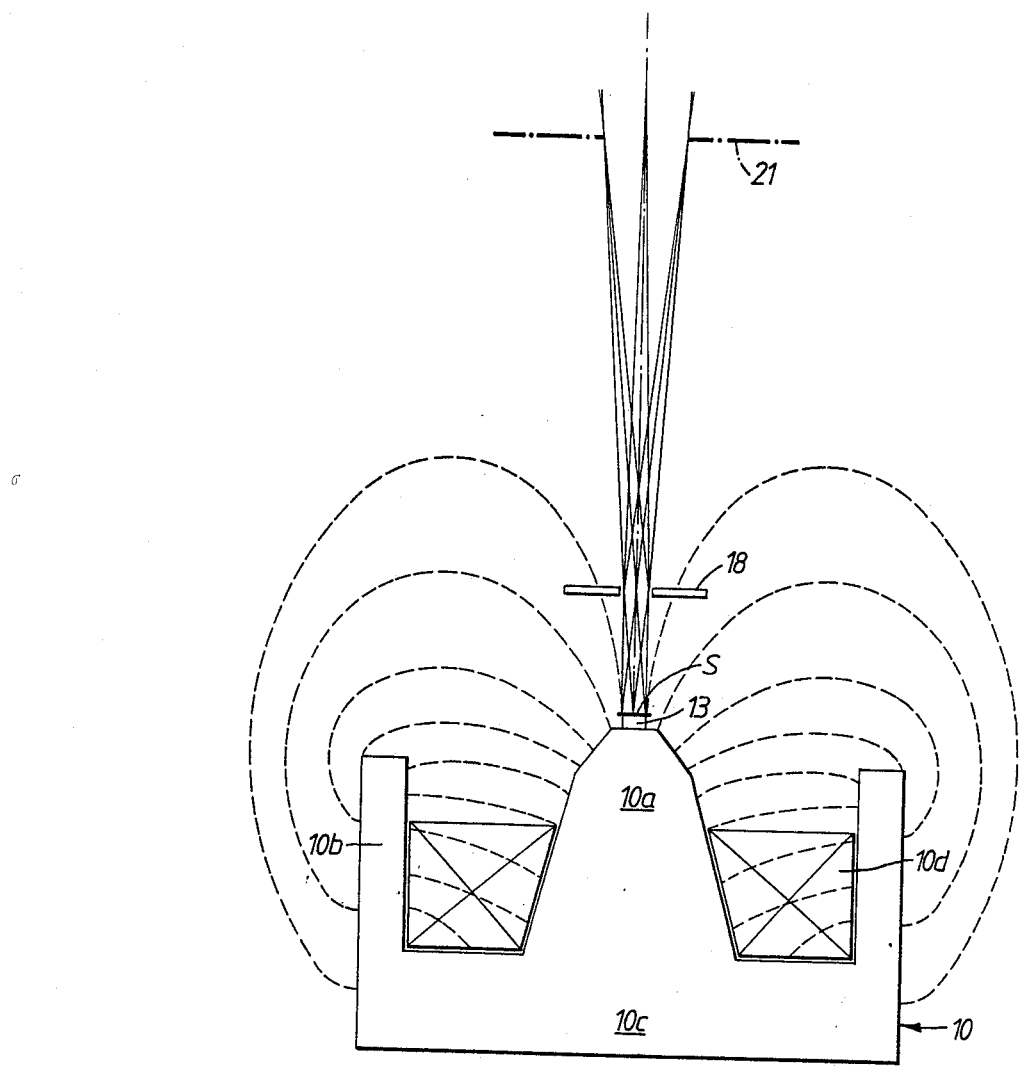
FIG. 2 is a diagrammatic section, on an enlarged scale, through the magnetic electron lens seen in FIG. 1.

Considering now the operation of the lens in greater detail, as illustrated in FIG. 2, upon energisation of the coil, the magnet formed by the parts 10a,10b,10c produces a magnetic field which is represented by chain lines. The flux lines of the single pole or snorkel lens indicate how an image of the surface is formed by electrons of a certain energy spread. The ray diagram shown is a straight line approximation to the curved trajectories which will be followed in practice. For a given specimen position and a given image plane, where a screen or aperture is placed, a given excitation of the lens will correspond to electrons of a relatively small energy band being focused. Electrons which have lower energies than this band will be focused short of the plane of aperture 21 and fail to pass through the aperture whilst those with energies higher will not be focused and most will also fail to pass through the aperture. Those electrons emitted along the central axis of the lens (which will pass through the centre of the aperture) will pass through the aperture whatever their energy but will be filtered off by the energy analyser.

Using such a lens, the magnetic field acts as an objective lens with a conventional amplification of $10-20\times$. With a photoelectron energy of 1 keV and a focal length of 4 mm it is calculated that the field required for focus is 0.1 Tesla and that the electron beam will twist through 130° about the axis of the microscope.

According to the strength of the lens 10, electrons of energy between $E_1 + \Delta E'$ and $E_1 - \Delta E'$ will pass through apertures 18 and 21 plus some electrons of other energy which travel along the central axis of the system. Electrons of other energy which do not travel along the axis will be filtered out by the aperture 21.

In order to preserve the spatial integrity of the image and to select an energy bandwidth between $E_1 + \Delta E''$ and $E_1 - \Delta E''$ (where $\Delta E''$ is significantly less than $\Delta E'$) an energy analysing device 23 is placed downstream of the second aperture 21.

This device 23 can conveniently be of the Castaing and Henry type which includes an electron mirror 24 and a magnetic prism 25.

Downstream of the analysing device 23 is a magnifying lens system 26 and this is followed by means which permit the magnified image to be converted into a form in which it can be recorded. Such conversion means can comprise a pair of electron multiplier channel plates 27 followed by a phosphor 28. The resulting light image can then be photographed or studied by a TV camera tube 30.

The positions of the analysing device 23 and of the magnifying lens 26 can be exchanged in the optical chain.

Other optional features can include a third aperture 31 at the exit of the energy analysing device and a channeltron electron multiplier 32 which can be moved behind the aperture 31 to produce an energy spectrum of a selected area.

If an extra stage of magnification is required an additional lens can be provided upstream or downstream of the imaging energy analysing device.

Figure 3:
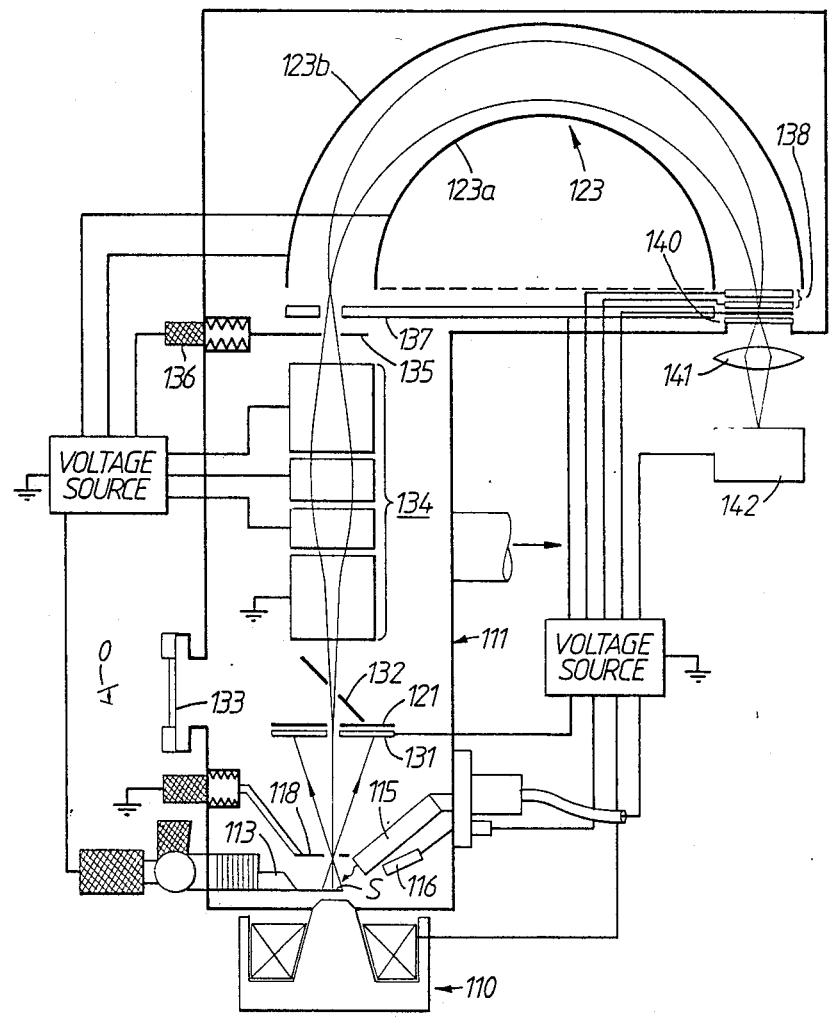
FIG. 3 is a modification of the analyser of FIG. 1.

An alternative embodiment of the invention in which the image is not preserved, is shown in FIG. 3.

In this embodiment, in which many parts are similar to those shown in FIG. 1, a magnetic electron lens 110 of the snorkel type is sealed to a vacuum enclosure 111, a specimen holder 113 being mounted on the axis of the lens. An X-ray source 115 is arranged to irradiate a specimen S on the holder 113 and a low energy gun 116 is located adjacent the specimen.

A first aperture 118 forming a collection aperture defines the specimen surface area from which electrons are received and the collected electrons are brought to a focus at a second apertured diaphragm or screen 121.

In order that the image on the screen 121 is sufficiently intense, a channel electron multiplier 131 is mounted on the upstream side of the screen.

The screen 121 is made of, or covered with, a thin layer of electron-luminescent material. In addition the screen is transparent, or nearly transparent, so that the luminescence can be observed in its downstream side. A mirror 132 allows an observer 0, or recording means, to view the screen through a window 133 in the vacuum enclosure 111.

Downstream of the aperture 121, an electrostatic multielectrode lens 134 is arranged to receive electrons from the aperture 121 and to retard and focus them. Downstream of the lens 134 is a slit 135 which can be altered in size by a manipulator 136, and forms the inlet slit of a non-imaging electrostatic energy analysing device 123.

The analysing device 123 has hemispherical inner and outer electrodes 123a,123b, and receives electrons from the slit 135 via a Herzog plate 137. The plate 137 serves to correct for fringing field effects produced by the electrodes 123a,123b.

Within the analysing device 123, the electrons are separated according to their energy and are recorded by means of a focal plane detector 138. This consists of a pair of channel electron multiplier plates. This amplified electron signal is accelerated on to a phosphor 140. The visible image produced on the phosphor 140 is then imaged using a light optical lens 141 on to a charged coupled detector array or other electronic light sensitive detector 142.

Using suitable electronic processing means, (not shown) the spectrum produced by the hemispherical analysing device or spectrometer 123 can be read out on to a suitable recording medium.

If an additional stage of magnification is required in the non-imaging device of FIG. 3, an additional lens can be provided which must be upstream of the energy analysing device. Furthermore an aperture must precede the analysing device so that the area of the specimen to be analysed can be selected by suitably positioning this aperture over the specimen. The whole photoelectric spectrum of the selected area can be obtained by scanning the snorkel lens excitation and the energy analysing device in synchronism.

In both of the embodiments of FIG. 1 and FIG. 3, when it is required to change the selected restricted area of the specimen from which charged particles are received by the analysing means, this can be achieved in a number of ways. First, the specimen holder can be moved laterally of the axis of the analyser by the manipulator 14 of FIG. 1. Alternatively, two axially-spaced sets of orthogonal pairs of spaced-apart electrode plates 33, 33'; 34,34' can be disposed about the path of the charged particles approaching aperture 21 and suitably energised to deflect the beam of charged particles, and so move the image relative to the aperture 21, (shown in FIG. 1 only). A further two axially-spaced sets of two orthogonal pairs of spaced-apart electrode plates 35,35'; 36,36' suitably energised, may be used downstream of the aperture 21, to realign the beam along the axis.

Figure 4:
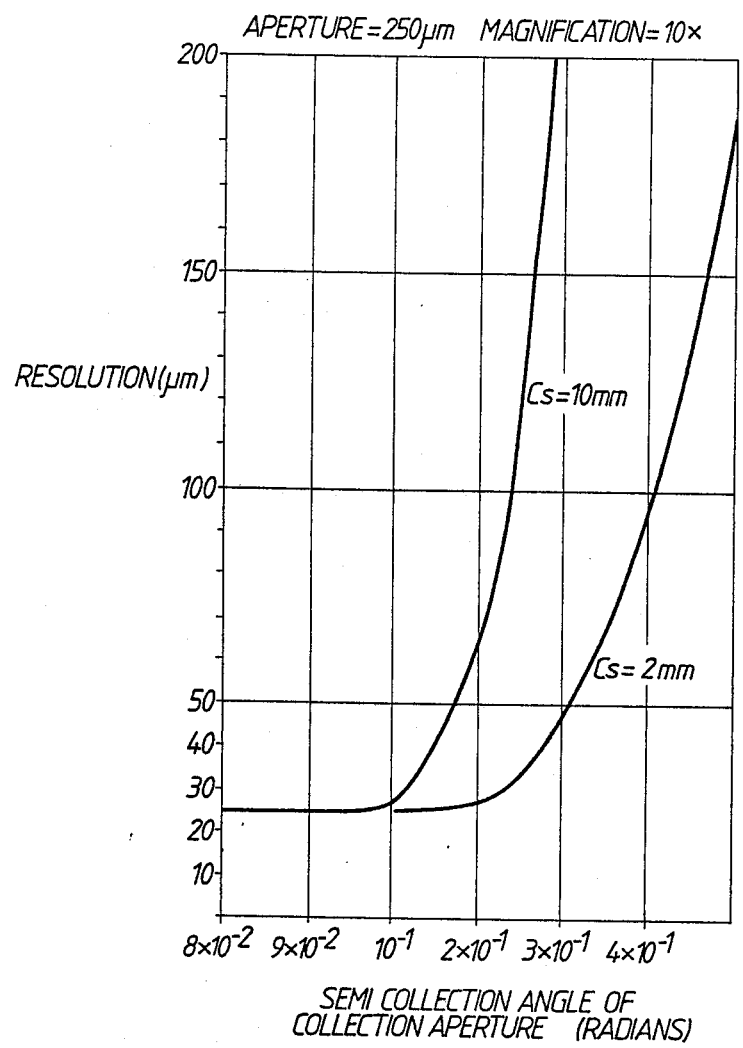
FIG. 4 is a graph representing the variation of spatial resolution as a function of the angular spread of electrons leaving the specimen surface for a given spherical aberration coefficient of the magnetic lens in an analyser such as that shown in FIG. 1 or FIG. 3.

The spatial resolution expected from an analyser such as that of FIG. 1 or FIG. 3 is related to the spherical aberration coefficient of the single pole lens or asymmetric lens as the case might be and the angle of emission of electrons from the specimen surface. The resolution versus the angle of emission is shown graphically in FIG. 4 for two different aberration coefficients namely 2 mm and 10 mm respectively. The magnification of the lens is assumed to be 10×. The diameter of the area of the specimen which can be resolved is evaluated in the following way.

Consider the specimen at the object plane of the lens and the electron trajectories from the specimen surface that travel to the selected area aperture 21 or 121 in a manner analogous to the formation of an electron image in a transmission electron microscope. Now the diameter of a selected area produced by a transmission electron microscope is given by the expression:

$$d = \sqrt{d_{SA}^2 + d_{Cs}^2} \quad (1)$$

where d is the actual resolved selected area at the specimen, $d_{SA}$ is the Gaussian selected area equal to $d_A \div M$ where $d_A$ is the selected area aperture diameter and M the magnification of the lens, and $d_{Cs}$ is the diameter of the disc of least confusion referred to the object plane, due to the spherical aberration of the lens. Other aberrations can be neglected in the present treatment.

The diameter of the disc of least confusion referred to the object plane due to spherical aberration is given by the expression $$d_{Cs} = \tfrac{1}{4} Cs \alpha^3 \quad (2)$$

where $d_{Cs}$ is defined above $\alpha$ is the semi-angle of rays from the specimen and Cs is the spherical aberration coefficient for the lens in its given excitation condition.

The spherical aberration coefficient depends on the lens excitation and is usually defined for an object at the focal point and its image at infinity, the coefficient under such conditions is usually denoted by $Cs_o$ and it is related to Cs by the relationship $$Cs = Cs_o (1 + 1/M)^4 \quad (3)$$

The magnification relevant to equation (3) is 10× thus $Cs = 1.464 Cs_o$

For a snorkel or single polepiece lens a typical value of $Cs_o$ is 2 mm at a focal length of 4 mm (see T. Mulvey in "Magnetic Electron Lenses" op cit pp 395–6) and so the value of Cs equals 2.928 mm and the diameter of the disc of confusion $d_{Cs}$ for a semi-angle of 0.2 radians (i.e. approx 11.5°) is 11.7 microns.

Having determined a value of $d_{Cs}$ a value is now needed for $d_{SA}$. If an aperture of 250 microns in diameter is placed in the image plane of the single polepiece lens to act as a selecting aperture and the magnification is 10× then the value of $d_{SA}$ is 250÷10 microns which equals 25 microns.

The selected area using $d_{Cs} = 11.6$ microns and $d_{SA} = 25$ microns is given by expression (1) and is equal to 27.6 microns. This agrees with the figure expressed on the graph of FIG. 4. Smaller semi-angles than 0.2 radians give better resolutions but sensitivity is lost.

I claim:

1. A charged particle energy analyser for investigating a selected area of the surface of a specimen comprising a specimen holder,
a source of radiation arranged to direct radiation on to an external surface of a specimen on the holder and to cause charged particles to be emitted therefrom,
a magnetic lens which generates a magnetic imaging field, the lens being so disposed that the specimen holder lies within and on the axis of the magnetic imaging field of the lens and particles emitted from the specimen are brought to a focus by the field, a diaphragm containing a collection aperture disposed on the axis of the field to define the collection angle of the lens and analysing means for analysing the energy of the charged particles collected from the specimen and received by said analysing means, characterised by a further diaphragm containing an aperture on or adjacent to the axis of the lens and located between said collection aperture and the analysing means to define a restricted area of the specimen from which the particles are brought to a focus and supplied to said analysing means.

2. A charged particle energy analyser according to claim 1 having means for changing the restricted area of the specimen from which the charged particles are received.

3. A charged particle analyser according to claim 2 wherein the means for changing the restricted area comprises means for deflecting the path of the charged particles relative to the axis of the analyser.

4. A charged particle energy analyser according to claim 1 having a magnifying lens located in the path of charged particles preceding the energy analysing means.

5. A charged particle energy analyser according to claim 1 wherein the magnetic lens is a snorkel type lens.

6. A charge particle energy analyzer according to claim 1 wherein the magnetic lens has asymmetric polepieces of substantially different diameters.

7. A charged particle energy analyzer according to claim 1 having means for changing the energy of the charged particles by simultaneously altering the strength of the magnetic imaging field of the lens and of the energy analyzing means.

8. A charge particle energy analyzer according to claim 1 having means for isolating the specimen holder from earth and electrostatically biasing it either positively or negatively with respect to earth potential.

9. A charged particle energy analyzer according to claim 1 having means for charge neutralizing an insulating specimen bombarded by a beam of particles selected from the group comprising electrons, ions, neutrals (selected from the group comprising atoms and molecules) and photons.

* * * * *